(12) United States Patent
Ramanathan et al.

(10) Patent No.: US 8,628,997 B2
(45) Date of Patent: Jan. 14, 2014

(54) METHOD AND DEVICE FOR CADMIUM-FREE SOLAR CELLS

(75) Inventors: Kannan Ramanathan, San Jose, CA (US); Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 171 days.

(21) Appl. No.: 13/236,286

(22) Filed: Sep. 19, 2011

(65) Prior Publication Data

US 2012/0240989 A1   Sep. 27, 2012

Related U.S. Application Data

(60) Provisional application No. 61/389,129, filed on Oct. 1, 2010.

(51) Int. Cl.
*H01L 31/18* (2006.01)

(52) U.S. Cl.
USPC ................ 438/85; 438/95; 136/264; 136/265

(58) Field of Classification Search
USPC ........................ 438/84, 85, 95, 104
See application file for complete search history.

(56) References Cited

U.S. PATENT DOCUMENTS

| | | | |
|---|---|---|---|
| 3,520,732 A | 7/1970 | Nakayama et al. | |
| 3,828,722 A | 8/1974 | Reuter et al. | |
| 3,975,211 A | 8/1976 | Shirland | |
| 4,062,038 A | 12/1977 | Cuomo et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |

(Continued)

FOREIGN PATENT DOCUMENTS

| | | |
|---|---|---|
| AU | 1998/78651 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — David Vu
*Assistant Examiner* — Earl Taylor
(74) *Attorney, Agent, or Firm* — Kilpatrick Townsend & Stockton LLP

(57) ABSTRACT

A method for fabricating a thin film photovoltaic device is provided. The method includes providing a substrate comprising a thin film photovoltaic absorber which has a surface including copper, indium, gallium, selenium, and sulfur. The method further includes subjecting the surface to a material containing at least a zinc species substantially free of any cadmium. The surface is heated to cause formation of a zinc doped material. The zinc doped material is free from cadmium. Furthermore the method includes forming a zinc oxide material overlying the zinc doped material and forming a transparent conductive material overlying the zinc oxide material.

19 Claims, 6 Drawing Sheets

(56) References Cited

U.S. PATENT DOCUMENTS

| | | | |
|---|---|---|---|
| 4,517,403 A | 5/1985 | Morel et al. | |
| 4,518,855 A | 5/1985 | Malak | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,612,411 A * | 9/1986 | Wieting et al. | 136/265 |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A * | 6/1988 | Vijayakumar et al. | 428/702 |
| 4,775,425 A | 10/1988 | Guha et al. | |
| 4,793,283 A | 12/1988 | Sarkozy | |
| 4,798,660 A | 1/1989 | Ermer et al. | |
| 4,816,082 A | 3/1989 | Guha et al. | |
| 4,816,420 A | 3/1989 | Bozler et al. | |
| 4,865,999 A | 9/1989 | Xi et al. | |
| 4,873,118 A | 10/1989 | Elias et al. | |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,069,727 A | 12/1991 | Kouzuma et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmom et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,259,883 A | 11/1993 | Yamabe et al. | |
| 5,261,968 A | 11/1993 | Jordan | |
| 5,298,086 A | 3/1994 | Guha et al. | |
| 5,336,381 A | 8/1994 | Dalzell, Jr. et al. | |
| 5,336,623 A | 8/1994 | Sichanugrist et al. | |
| 5,346,853 A | 9/1994 | Guha et al. | |
| 5,397,401 A | 3/1995 | Toma et al. | |
| 5,399,504 A | 3/1995 | Ohsawa | |
| 5,436,204 A | 7/1995 | Albin et al. | |
| 5,445,847 A | 8/1995 | Wada | |
| 5,474,939 A * | 12/1995 | Pollock et al. | 438/85 |
| 5,501,744 A | 3/1996 | Albright et al. | |
| 5,512,107 A | 4/1996 | van den Berg | |
| 5,528,397 A | 6/1996 | Zavracy et al. | |
| 5,536,333 A | 7/1996 | Foote et al. | |
| 5,578,103 A | 11/1996 | Araujo et al. | |
| 5,578,503 A | 11/1996 | Karg et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,698,496 A | 12/1997 | Fastnacht et al. | |
| 5,726,065 A | 3/1998 | Szlufcik et al. | |
| 5,738,731 A | 4/1998 | Shindo et al. | |
| 5,804,466 A * | 9/1998 | Arao et al. | 438/95 |
| 5,858,819 A | 1/1999 | Miyasaka | |
| 5,868,869 A | 2/1999 | Albright et al. | |
| 5,925,228 A | 7/1999 | Panitz et al. | |
| 5,948,176 A * | 9/1999 | Ramanathan et al. | 136/264 |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,107,562 A * | 8/2000 | Hashimoto et al. | 136/252 |
| 6,127,202 A | 10/2000 | Kapur et al. | |
| 6,160,215 A | 12/2000 | Curtin | |
| 6,166,319 A | 12/2000 | Matsuyama | |
| 6,172,297 B1 | 1/2001 | Hezel et al. | |
| 6,258,620 B1 | 7/2001 | Morel et al. | |
| 6,288,325 B1 | 9/2001 | Jansen et al. | |
| 6,294,274 B1 | 9/2001 | Kawazoe et al. | |
| 6,307,148 B1 | 10/2001 | Takeuchi et al. | |
| 6,310,281 B1 | 10/2001 | Wendt et al. | |
| 6,323,417 B1 | 11/2001 | Gillespie et al. | |
| 6,328,871 B1 | 12/2001 | Ding et al. | |
| 6,361,718 B1 | 3/2002 | Shinmo et al. | |
| 6,372,538 B1 | 4/2002 | Wendt et al. | |
| 6,423,565 B1 | 7/2002 | Barth et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 * | 2/2007 | Ramanathan et al. | 438/95 |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,319,190 B2 | 1/2008 | Tuttle | |
| 7,364,808 B2 | 4/2008 | Sato et al. | |
| 7,390,731 B2 * | 6/2008 | Kroll et al. | 438/608 |
| 7,441,413 B2 | 10/2008 | Bae et al. | |
| 7,442,413 B2 | 10/2008 | Zwaap et al. | |
| 7,544,884 B2 | 6/2009 | Hollars | |
| 7,611,573 B2 * | 11/2009 | Bhattacharya | 106/286.6 |
| 7,736,755 B2 | 6/2010 | Igarashi et al. | |
| 7,741,560 B2 | 6/2010 | Yonezawa | |
| 7,855,089 B2 | 12/2010 | Farris, III et al. | |
| 7,863,074 B2 | 1/2011 | Wieting | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,026,122 B1 | 9/2011 | Lee | |
| 8,142,521 B2 | 3/2012 | Wieting | |
| 8,168,463 B2 | 5/2012 | Wieting | |
| 8,178,370 B2 | 5/2012 | Lee et al. | |
| 8,183,066 B2 | 5/2012 | Lee et al. | |
| 8,217,261 B2 | 7/2012 | Wieting | |
| 8,263,494 B2 | 9/2012 | Patterson | |
| 8,287,942 B1 | 10/2012 | Huang et al. | |
| 8,361,831 B2 * | 1/2013 | Yane | 438/85 |
| 2002/0002992 A1 | 1/2002 | Kariya et al. | |
| 2002/0004302 A1 | 1/2002 | Fukumoto et al. | |
| 2002/0061361 A1 | 5/2002 | Nakahara et al. | |
| 2002/0063065 A1 | 5/2002 | Sonoda et al. | |
| 2003/0075717 A1 | 4/2003 | Kondo et al. | |
| 2003/0089899 A1 | 5/2003 | Lieber et al. | |
| 2003/0188777 A1 | 10/2003 | Gaudiana et al. | |
| 2003/0230338 A1 | 12/2003 | Menezes | |
| 2004/0063320 A1 | 4/2004 | Hollars | |
| 2004/0084080 A1 | 5/2004 | Sager et al. | |
| 2004/0095658 A1 | 5/2004 | Buretea et al. | |

(56) References Cited

U.S. PATENT DOCUMENTS

| | | | |
|---|---|---|---|
| 2004/0110393 A1 | 6/2004 | Munzer et al. | |
| 2004/0161539 A1 | 8/2004 | Miyakawa | |
| 2004/0187917 A1 | 9/2004 | Pichler | |
| 2004/0235286 A1* | 11/2004 | Kroll et al. | 438/609 |
| 2004/0245912 A1 | 12/2004 | Thurk et al. | |
| 2004/0252488 A1 | 12/2004 | Thurk | |
| 2004/0256001 A1 | 12/2004 | Mitra et al. | |
| 2005/0074915 A1 | 4/2005 | Tuttle et al. | |
| 2005/0098205 A1 | 5/2005 | Roscheisen et al. | |
| 2005/0109392 A1 | 5/2005 | Hollars | |
| 2005/0164432 A1 | 7/2005 | Lieber et al. | |
| 2005/0194036 A1 | 9/2005 | Basol | |
| 2005/0257825 A1* | 11/2005 | Ramanathan et al. | 136/262 |
| 2005/0287717 A1 | 12/2005 | Heald et al. | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0112983 A1 | 6/2006 | Parce et al. | |
| 2006/0130890 A1 | 6/2006 | Hantschel et al. | |
| 2006/0160261 A1 | 7/2006 | Sheats et al. | |
| 2006/0173113 A1 | 8/2006 | Yabuta et al. | |
| 2006/0174932 A1 | 8/2006 | Usui et al. | |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2006/0249202 A1 | 11/2006 | Yoo et al. | |
| 2006/0267054 A1 | 11/2006 | Martin et al. | |
| 2007/0006914 A1 | 1/2007 | Lee | |
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |
| 2007/0157966 A1* | 7/2007 | Meguro et al. | 136/258 |
| 2007/0163643 A1 | 7/2007 | Van Duren et al. | |
| 2007/0169810 A1 | 7/2007 | Van Duren et al. | |
| 2007/0193623 A1 | 8/2007 | Krasnov | |
| 2007/0209700 A1 | 9/2007 | Yonezawa et al. | |
| 2007/0264488 A1 | 11/2007 | Lee | |
| 2007/0283998 A1 | 12/2007 | Kuriyagawa et al. | |
| 2007/0289624 A1 | 12/2007 | Kuriyagawa et al. | |
| 2008/0029154 A1 | 2/2008 | Mishtein et al. | |
| 2008/0032044 A1* | 2/2008 | Kuriyagawa et al. | 427/255.33 |
| 2008/0041446 A1 | 2/2008 | Wu et al. | |
| 2008/0057616 A1 | 3/2008 | Robinson et al. | |
| 2008/0092945 A1 | 4/2008 | Munteanu et al. | |
| 2008/0092953 A1 | 4/2008 | Lee | |
| 2008/0092954 A1 | 4/2008 | Choi | |
| 2008/0105294 A1 | 5/2008 | Kushiya et al. | |
| 2008/0110491 A1 | 5/2008 | Buller et al. | |
| 2008/0110495 A1 | 5/2008 | Onodera et al. | |
| 2008/0121264 A1 | 5/2008 | Chen et al. | |
| 2008/0121277 A1 | 5/2008 | Robinson et al. | |
| 2008/0204696 A1 | 8/2008 | Kamijima | |
| 2008/0210303 A1 | 9/2008 | Lu et al. | |
| 2008/0280030 A1 | 11/2008 | Van Duren et al. | |
| 2008/0283389 A1 | 11/2008 | Aoki | |
| 2009/0021157 A1 | 1/2009 | Kim et al. | |
| 2009/0058295 A1 | 3/2009 | Auday et al. | |
| 2009/0087940 A1* | 4/2009 | Kushiya | 438/94 |
| 2009/0087942 A1 | 4/2009 | Meyers | |
| 2009/0145746 A1 | 6/2009 | Hollars | |
| 2009/0191359 A1* | 7/2009 | Bhattacharya | 427/560 |
| 2009/0217969 A1 | 9/2009 | Matsushima et al. | |
| 2009/0223556 A1* | 9/2009 | Niesen et al. | 136/255 |
| 2009/0234987 A1 | 9/2009 | Lee et al. | |
| 2009/0235983 A1 | 9/2009 | Girt et al. | |
| 2009/0235987 A1 | 9/2009 | Akhtar et al. | |
| 2009/0293945 A1 | 12/2009 | Peter | |
| 2010/0081230 A1 | 4/2010 | Lee | |
| 2010/0087016 A1 | 4/2010 | Britt et al. | |
| 2010/0087026 A1 | 4/2010 | Winkeler et al. | |
| 2010/0096007 A1 | 4/2010 | Mattmann et al. | |
| 2010/0101648 A1 | 4/2010 | Morooka et al. | |
| 2010/0101649 A1 | 4/2010 | Huignard et al. | |
| 2010/0122726 A1 | 5/2010 | Lee | |
| 2010/0167460 A1* | 7/2010 | Yane | 438/85 |
| 2010/0197051 A1 | 8/2010 | Schlezinger et al. | |
| 2010/0210064 A1 | 8/2010 | Hakuma et al. | |
| 2010/0233386 A1 | 9/2010 | Krause et al. | |
| 2010/0243045 A1* | 9/2010 | Tsuchiya et al. | 136/256 |
| 2010/0255630 A1* | 10/2010 | Meyer et al. | 438/84 |
| 2010/0258179 A1 | 10/2010 | Wieting | |
| 2010/0267190 A1 | 10/2010 | Hakuma et al. | |
| 2011/0018103 A1* | 1/2011 | Wieting | 257/613 |
| 2011/0020980 A1 | 1/2011 | Wieting | |
| 2011/0056541 A1* | 3/2011 | Martinez et al. | 136/252 |
| 2011/0070682 A1 | 3/2011 | Wieting | |
| 2011/0070683 A1 | 3/2011 | Wieting | |
| 2011/0070684 A1 | 3/2011 | Wieting | |
| 2011/0070685 A1 | 3/2011 | Wieting | |
| 2011/0070686 A1 | 3/2011 | Wieting | |
| 2011/0070687 A1 | 3/2011 | Wieting | |
| 2011/0070688 A1 | 3/2011 | Wieting | |
| 2011/0070689 A1 | 3/2011 | Wieting | |
| 2011/0070690 A1 | 3/2011 | Wieting | |
| 2011/0071659 A1 | 3/2011 | Farris, III et al. | |
| 2011/0073181 A1 | 3/2011 | Wieting | |
| 2011/0203634 A1 | 8/2011 | Wieting | |
| 2011/0212565 A1 | 9/2011 | Wieting | |
| 2011/0259395 A1 | 10/2011 | Wieting et al. | |
| 2011/0259413 A1 | 10/2011 | Wieting et al. | |
| 2011/0263064 A1* | 10/2011 | Wieting | 438/61 |
| 2011/0269260 A1 | 11/2011 | Buquing | |
| 2011/0277836 A1 | 11/2011 | Lee | |
| 2012/0003789 A1 | 1/2012 | Doering et al. | |
| 2012/0018828 A1 | 1/2012 | Shao | |
| 2012/0021552 A1 | 1/2012 | Alexander et al. | |
| 2012/0073649 A1* | 3/2012 | Blue et al. | 136/258 |
| 2012/0094432 A1 | 4/2012 | Wieting | |
| 2012/0122304 A1 | 5/2012 | Wieting | |
| 2012/0186975 A1 | 7/2012 | Lee et al. | |
| 2012/0270341 A1 | 10/2012 | Lee et al. | |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "CuInS$_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett.

(56) References Cited

OTHER PUBLICATIONS 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of $CuInS_2$ Thin Films Solar Cells with Large Grain, Elsevier Science B.V; Solar Energy Materials & Solar Cells 69 (2001) pp. 261-269.

Salvador, "Hole diffusion length in $n$-$TiO_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

METHOD AND DEVICE FOR CADMIUM-FREE SOLAR CELLS

CROSS-REFERENCE TO RELATED APPLICATION

This application claims priority to U.S. Provisional Application No. 61/389,129, entitled "Method and Device for Cadmium-Free Solar Cells," filed on Oct. 1, 2010, by Kannan Ramanathan and Robert D. Wieting, commonly assigned, and hereby incorporated by reference in its entirety herein for all purpose.

BACKGROUND OF THE INVENTION

The present invention relates generally to photovoltaic materials and manufacturing method. More particularly, the invention provides a device for a thin-film photovoltaic cell without a cadmium-based buffer layer and a method for making thereof. The present method and device provide a thin film photovoltaic cell using a copper indium diselenide absorber material and a cadmium-free window buffer material.

Environmentally clean and renewable sources of energy are desired. An example of a clean source of energy is hydroelectric power. Clean and renewable sources of energy also include wind, waves, biomass, and the like. That is, windmills convert wind energy into more useful forms of energy such as electricity. Still other types of clean energy include solar energy.

Solar energy technology generally converts electromagnetic radiation from the sun to other useful forms of energy. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, thin-film photovoltaic cells traditionally use exotic elements including cadmium, mercury, or telluride, which substantially limit the applications and cause environmental side effects. Often, such thin-film solar devices are difficult to handle during their manufacture processes because of these toxic materials.

From the above, it is seen that improved techniques for manufacturing photovoltaic materials and resulting devices are desired.

BRIEF SUMMARY OF THE INVENTION

The present invention provides a method and a structure for forming a photovoltaic cell. More particularly, the invention provides a method and a thin film device without using cadmium. Embodiments according to the present invention have been implemented in a thin-film solar cell with copper-indium-gallium-diselenide (CIGS) based absorber material and cadmium-free, buffer-free window material.

In a specific embodiment, a method for fabricating a thin film photovoltaic device free from a heavy metal including cadmium is provided. The method includes providing a substrate comprising a thin film photovoltaic absorber. The thin film photovoltaic absorber comprises a surface region including copper species, indium species, gallium species, selenium species, and sulfur species. The surface region is coated with a material containing at least zinc, substantially free of cadmium. Additionally, the method includes a heating step within the surface region to cause formation of a zinc doped material within a depth of the thin-film photovoltaic absorber from the surface region. Then a zinc oxide material is formed over the zinc doped material, followed by forming a transparent conductive material over the zinc oxide material.

In an alternative embodiment, the invention provides a thin film photovoltaic device which includes a substrate and a barrier material overlying the substrate. A first electrode overlies the barrier material, and absorber material overlies the first electrode. The absorber material has a surface region and includes copper, indium, gallium and selenium, characterized by a Cu/(In+Ga) ratio of 0.9±0.05 and p-type conductivity. A junction structure is confined between the surface region. The junction structure is doped by n-type dopants substantially free of cadmium. Furthermore, the device includes a first layer of zinc oxide overlying the junction layer, as well as a second layer of zinc oxide overlying the first zinc oxide. The first zinc oxide has a first resistivity and a first optical transparency and the second zinc oxide material has a second resistivity and a second optical transparency. The first resistivity is substantially greater than the second resistivity and the second optical transparency is equal to or greater than the first optical transparency.

Many benefits can be achieved by embodiments according to the present invention. For example, the thin film single junction photovoltaic cell can be fabricated using in a simplified process, yet with conventional equipment. Advantages of the embodiments of the present method eliminate the use of toxic elements such as cadmium. The process further saves processing material and reduces environmental harm, yet the device achieves high photovoltaic efficiency without need of a buffer layer. The device and its manufacturing method lead to a much improved cost saving and cleaner way to convert sunlight into electric energy.

DETAILED DESCRIPTION OF THE INVENTION

Figure 1:
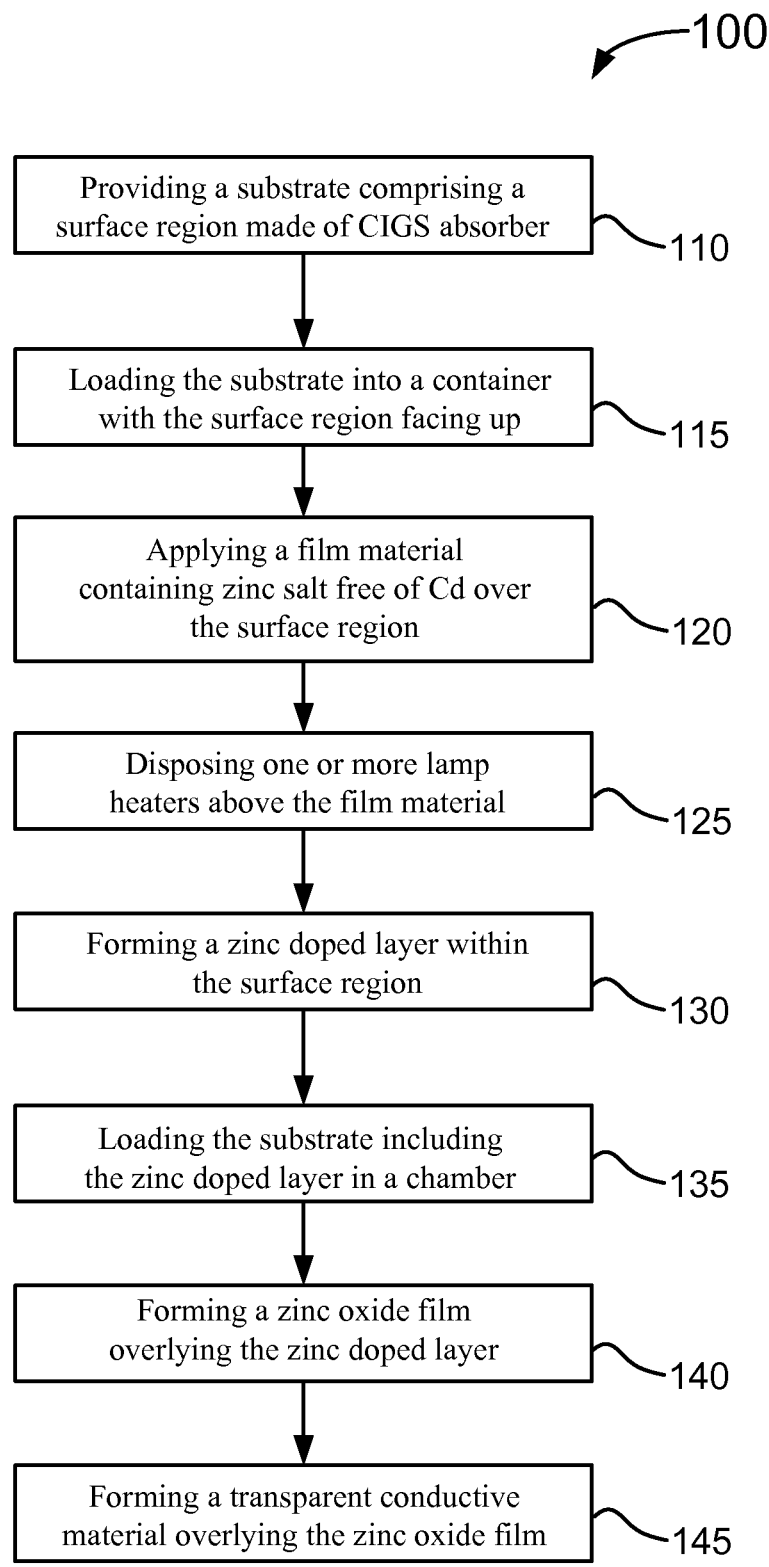
FIG. 1 is a process flow diagram illustrating a method of fabricating a thin film photovoltaic device.
Figure 2:
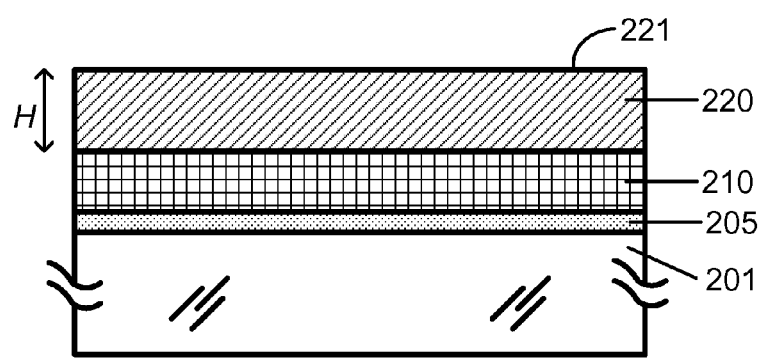
FIG. 2 is a diagram illustrating a sectional view of a thin film device for fabricating Cd-free solar cells.

FIG. 1 is a process flow diagram illustrating a method of fabricating a thin film photovoltaic device. As shown, the method 100 begins with a process 110 for providing a substrate for fabricating a thin-film photovoltaic device. The resulting device is illustrated in FIG. 2. In the example, substrate 201 is a transparent material such as glass, fused silica, or quartz. In a specific embodiment, the substrate is a soda lime glass. The process 110 includes forming a barrier material 205 overlying the substrate 201. The barrier material is used as a diffusion barrier for preventing sodium and other elements in the soda lime glass substrate from diffusing into the solar cell. Barrier material 205 can be silicon oxide, silicon nitride, titanium nitride, or other material. The process 110 further includes forming a conductive material 210 overlying the barrier material 205. In an example, the conductive material 210 can be patterned across the substrate to form a plurality of cell structures. Within each cell structure the conductive material 210 becomes a first electrode for each cell. Conductive material 210 is molybdenum in one embodiment. Other electrode materials such as transparent conductive oxide material, other metal materials may also be used, depending on the application.

An absorber material 220 is formed over the first electrode for each cell. Typically the absorber material is a copper-indium-gallium-diselenide (CIGS) or copper-indium-gallium-selenium-sulfide (CIGSS) compound. It is formed in a two-step process by depositing a precursor thin film comprising copper, indium, or gallium species (overlying the first electrode) on the substrate and then performing a selenization and sulfurization process to treat the precursor at an elevated temperature to form the CIGS/CIGSS material. In certain embodiments, gallium is not included to obtain a CIS material. In other embodiments, the precursor material includes sodium which helps to modify the column grain structure of the CIS/CIGS/CIGSS thin film and enhance the power efficiency of the solar cell. Depending on the precursor preparation process including chemical stoichiometry control for the target devices and sputtering conditions, the absorber material has a preferred atomic concentration ratio for Cu/(In+Ga) of about 0.9±0.05, leading to efficiencies of 14% and higher. In certain other embodiments, the absorber material also contains sulfur appeared in compound $CuInGa(SeS)_2$. Alternatively, the absorber material contains a combination of $CuInGaSe_2$ and $CuInGa(SeS)_2$. A more detailed description is found in U.S. patent application Ser. No. 12/568,641, commonly assigned to Stion Corporation, San Jose, Calif., and incorporated by reference herein for all purposes.

Referring to FIG. 2, the absorber material 220 formed after the selenization and sulfurization process is a thin film having a surface region 221 exposed at the top and a thickness H for the film region. Depending on the doping species mixed in during the precursor formation process and interaction with selenium and sulfur gaseous species during the reactive thermal treatment process, absorber material 220 will have p-type conductivity throughout its thickness. In another embodiment, absorber material 220 is a substantially gray body and can absorb almost the entire visible spectrum, and the infrared region. When exposed to visible light, the absorber material 220 converts sunlight to electric current. When exposed to infrared light, the absorber material 220, heats quickly, converting the absorbed infrared light to thermal energy. The thermal energy can be transferred to any material in a vicinity of the surface region of the absorber material.

Figure 3:
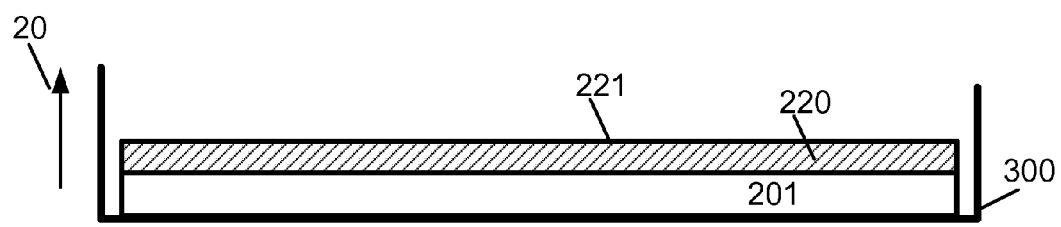
FIG. 3 is a diagram illustrating a method for processing Cd-free solar cells.

As shown in FIG. 1, the method 100 further includes a process 115 for loading the substrate into a processing container with the surface region (of the absorber material) facing up. This process 115 is preparing the substrate and associated absorber material for surface treatment using chemical or thermal treating methods. Typically, the substrate has a planar shape, although other shapes including cylindrical, semi-spherical, flexible foil, or other shapes, can be used. FIG. 3 shows a substrate 201 having an overlying absorber material 220 loaded into a processing container 300. The absorber material 220 has a surface region 221 exposed and faced upward as indicated by arrow 20.

Figure 4A:
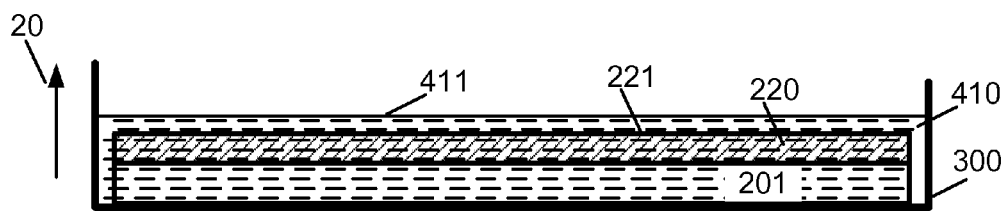
FIGS. 4A and 4B are diagrams illustrating optional processes for fabricating Cd-free solar cells.

Referring to FIG. 1 again, the method 100 includes a process 120 for disposing a film material overlying the surface region. The film material includes zinc and is substantially free from cadmium, wherein the zinc species is intended to be doped either chemically or physically into the absorber material through the surface region. The film material can be either in a fluidic state or in a solid state. FIG. 4A is a diagram illustrating film material 410 in a liquid form in processing container 300 where a substrate 201 has been disposed with an exposed surface region 221 of absorber material 220. As shown, the surface 221 is facing upward. The film material is a liquid solution introduced with a surface 411 completely submerging the surface region 221. The liquid surface 411 is preferably a few millimeters above the surface 221. In a specific embodiment, the liquid solution 410 is an electrolyte containing a zinc salt solvent, ammonium hydroxide, and water. The zinc salt can be selected from various zinc compounds such as zinc chloride $ZnCl_2$, zinc sulfide $ZnSO_4$, etc. The range of concentration for the zinc compound is 0.0001 mol to 0.1 mol, and for ammonium hydroxide 0.1 mol to 5 mol. Typically the liquid electrolyte solution is introduced substantially at room temperature.

Figure 4B:
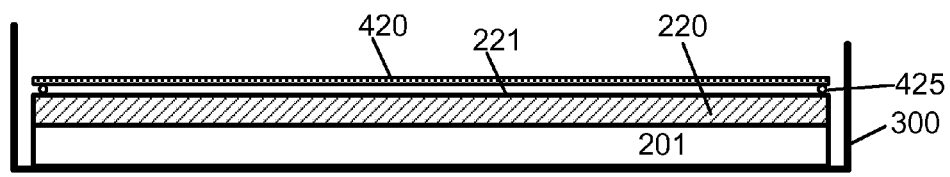

In an alternative embodiment, FIG. 4B illustrates a film material 420 in solid form applied over the surface 221. Film material 420 is spaced above the surface 221 with a gap ranging from 1 mm to 5 mm, e.g. by 425. Alternatively, the substrate bearing the solid film material 420 can be placed against the surface 221, provided that a handling mechanism is designed accordingly. In the configuration shown in FIG. 4B, because the film material 420 is a solid, the sample substrate 201 and associated absorber material 220 can be configured to non-horizontal orientations, depending on convenience of a manufacturing processes.

As shown in FIG. 1, the method 100 includes a process 125 for heating the film material. The heaters provide thermal energy for inducing a doping process via either chemical or physical diffusion of desired dopant species within the film material into the surface region. A conventional way of heating the film material, especially for liquid film material, is to use the container itself as a heater, and maintaining the contents at an elevated temperature. That approach, however, requires more energy and causes the liquid to be somewhat unstable in its chemical properties, such as ph value, solvent concentration, etc. The present invention introduces a new approach of loading the substrate to be submerged, just under the surface of the liquid. This approach makes the process 125 of using lamp heaters an advantageous process to induce Cd-free doping from the film material into the surface region on the substrate.

Figure 5A:
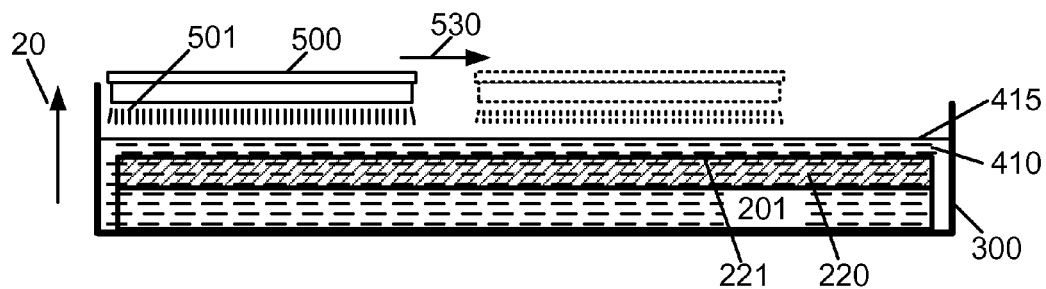
FIGS. 5A and 5B are diagrams illustrating optional processes for fabricating Cd-free solar cells.

In a specific embodiment, as illustrated in FIG. 5A, the surface 221 of the absorber material 220 is fully submerged into the liquid solution 410 but in close proximity to the liquid surface. The lamp heater 500 above the liquid surface 415 provides thermal radiation 501 to the liquid 410 and the surface 221. Lamp heater(s) 500 can be typical quartz lamp heaters used in semiconductor processing for providing timed heat control. Additionally the lamp heaters can have an elongated shape cover the large substrate dimension. In a specific embodiment, the lamp heaters 500 are configured to scan together along either the length or width of the substrate 201 in the processing container 300. A scanning mechanism 530 controlled to provide scanning step size, speed, and direction assures proper heating of each region of the surface 221. One advantage of using infrared heaters is the absorber material 220 is gray material which absorbs infrared light efficiently, thereby being heated quickly to a controllable depth. Careful control of the lamp heaters causes only a small portion of the absorber material 220 to be heated to a desired depth from the surface 221. This allows for relative higher surface temperature to be reached than by dipping the substrate into a warm liquid solution. Furthermore, only a portion of liquid solution 410 under the lamp heaters within a close proximity is heated to an elevated temperature for causing the doping process between the liquid film material 410 above the surface 221 of the absorber material 220. The localized liquid heating provides better stability of the solution mixture and minimize ammonia loss.

Figure 5B:
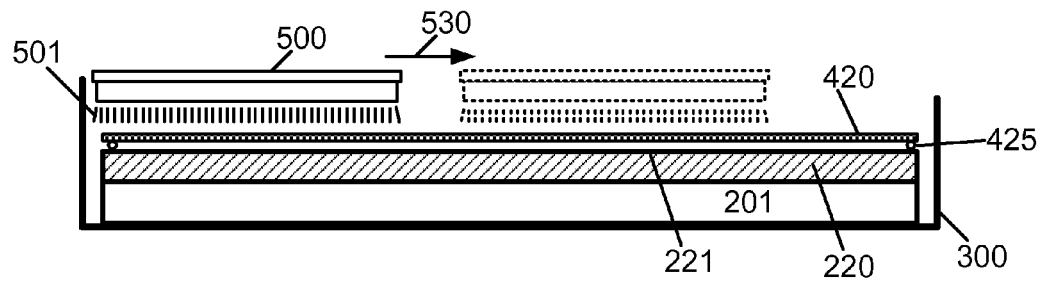

In an alternative embodiment as shown in FIG. 5B, the film material 420 is in solid form. The alternative substrate is substantially transparent to thermal radiation (at least for infrared) so that the process 125 of using lamp heaters 500 with a scanning mechanism 530 can be adapted to this configuration. The film material 420 contains zinc compound that is volatile under the illumination of infrared light 501 and is able to diffuse out of the film material 420. The surface region 221 which is directly under the film material 420, is also heated and is able to receive the zinc down to the depth into the film region of the absorber material 220. The use of a solid layer enables the process to be carried out in almost any orientation, as opposed to being limited to horizontal.

Referring further to FIG. 1, the method 100 includes a process 130 for forming a zinc doped layer within the surface region. As shown in both FIG. 5A and the FIG. 5B, the method 100 has established a localized surface heating using both the loading configuration and use of lamp heaters. In a specific embodiment, the surface region of the absorber material includes a CIS/CIGS/CIGSS compound. Because thermal power can be well controlled by the lamp heaters, only a surface reaction takes place and dopant diffusion only occurs from the film material (either a liquid solution or a volatile solid film) into a particular depth of the absorber material. In particular, the reaction rate between the liquid solution containing zinc chloride and ammonium hydroxide with the CIS/CIGS/CIGSS absorber material is limited by the temperature at the depth where it is needed. The ammonium hydroxide content in the liquid film material helps to clean the surface by reacting with the sodium in the CIS/CIGS/CIGSS absorber material or oxides formed on the surface region. This enables reducing the thickness of the barrier for blocking the zinc species diffusion through the surface region. Also, the zinc diffusion depth is more easily controlled as the diffusion rate is highly depended on the temperature. Therefore, the process 130 causes a transformation of a portion of the absorber material from the surface region down to the depth from the CIS/CIGS/CIGSS material to a layer doped with a substantial amount of zinc. In particular, by a selection of the film material the dopants can be made substantially free of cadmium or other toxic elements.

Figure 6:
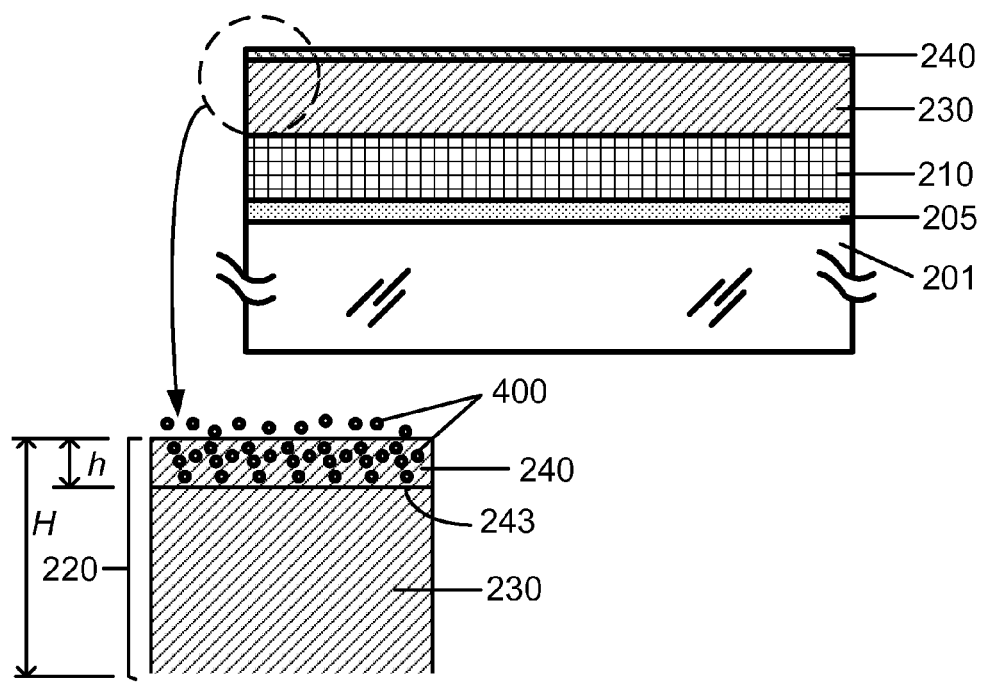
FIG. 6 is a diagram illustrating a sectional view of a photovoltaic junction structure for a Cd-free solar cell.

FIG. 6 is a cross-sectional view of a zinc doped layer formed in the surface of absorber material based on the process described above. As shown, the original absorber material having a thickness H of film region now is transformed into two regions separated by an interface region 243. Below the interface region 243 is a film region 230 being essentially the absorber material with its original characteristics. Above the interface region 243 up to the surface is an junction structure 240 having a thickness h which corresponds to the depth of the zinc 400 diffused from the film material (see FIGS. 5A and 5B).

In one embodiment, the thickness H of the original absorber material 220 ranges from 1 µm to 2 µm. The junction structure 240 can have a thickness ranging from 10 nm to 50 nm, about 0.5 to 5 percent of the total thickness of original absorber material. It is known that the zinc species is a good n-type donor for the CIS/CIGS/CIGSS compound. As a result of the thermal assisted diffusion process, at least some of the zinc in the junction structure may be ionized and become a n-type dopant therein. The zinc doping helps to transform a top portion of the absorber material characterized by p-type conductivity into a junction structure characterized by n-type conductivity. In other words, the interface region 243 becomes a boundary separating a p-type film region 230 and an n-type region 240, forming a semiconductor p-n junction. Depending on the embodiments and applications, the zinc diffused into the junction region is about $10^{20}$ cm$^{-3}$ in atomic concentration and n-type doping level due to ionized zinc species can range from $10^{15}$ cm$^{-3}$ to $10^{18}$ cm$^{-3}$. The zinc doping substantially replaces the role of cadmium played in an n-type CdS buffer layer formed on top of the CIS/CIGS/CIGSS absorber material. Of course, other surface reaction and diffusion methods can be used to form the layers described herein.

In one embodiment, the method 100 further includes a process 135 to load the substrate including the CIS/CIGS/CIGSS absorber p-n junction without cadmium species into a chamber. In certain implementation, the surface of the above substrate with the p-n junction can be pre-treated using fluidic chemical including ammonium hydroxide or cyanide to clean up and remove some oxides. The chamber is a vacuum chamber designed for performing metal-organic chemical vapor deposition (MOCVD). One or more conductive transparent materials can be deposited over the zinc doped junction layer formed in process 130.

Following process 135, a process 140 for depositing zinc oxide film material over the zinc-doped junction structure is performed. In a specific embodiment, the zinc oxide is deposited using a MOCVD technique in the chamber with a vacuum environment. Then a work gas including reactants and dopants is mixed with a carrier gas, flowing into the chamber. In one embodiment the reactants include a zinc bearing species such as diethylzinc gas mixed with water vapor. The dopants can include diborone gas. The carrier gas is an inert gas, e.g. nitrogen, argon, or helium. The substrate, as loaded on a heating plate, heated to a temperature in a range of 150° C. to 250° C., preferably within 200-250° C. At these elevated temperatures, zinc in the diethylzinc gas decomposes and reacts with the oxygen in water vapor to form a zinc oxide film on the surface of the junction structure. At the same time, additional zinc species within the junction structure may be further activated to contribute for final n-type conductivity of the junction structure or window layer for the solar cell.

At the same time, the zinc dopant is subjected to further thermal diffusion within the layer so that the junction location or the interface region may shift. In a specific embodiment, the zinc oxide film over the junction may be formed using a MOCVD process without extra doping. The process can be carried out with a reduced flow of, or elimination of dopant gas so that the zinc oxide film has a high resistivity. In an example, the high resistivity is in a range of about $10^2$ to $10^4$ mΩ·cm and greater. The relative high resistivity of the zinc oxide film helps to reduce the possibility of shunts, or formation of conducting phases, so that a good ohmic contact can be formed. The zinc oxide film has good optical transparency, e.g. an optical transmission rate of 80% and greater at least for light spectrum ranging from near UV to infrared light. The zinc oxide film material formed in this process can have a thickness range from 10 nm to 100 nm for minimizing shunting while keeping good optical transparency. In another embodiment, the zinc oxide film material without adding diborone dopant gas can be replaced by depositing a $ZnO_{1-x}S_x$ material by continuously flowing water vapor and $H_2S$ gas during the MOCVD process. In yet another embodiment, the zinc oxide film material bearing characteristics of relative high resistivity and substantial transparency to sun light spectrum is formed overlying the zinc-doped junction structure to lead a formation of a Cd-free window material for the thin-film solar cell for collecting electrons converted from photons by the absorber material.

Method 100 includes a process 145 of forming a transparent conductive electrode over the zinc oxide film. Many transparent conductive oxides (TCO) such as zinc oxide, indium tin oxide (ITO), fluorine doped tin oxide (FTO), and the like can be used. One approach is to continue depositing a second zinc oxide film material within the previous chamber using MOCVD process for forming the first zinc oxide film material in process 140. In a specific embodiment, the dopants gas flow during MOCVD process is adjusted for appropriate physical characteristics of the transparent conductive material. For example, the diborone gas flow may be turned on with a flow rate so that boron doping occurs during the formation of the second zinc oxide film material. The second zinc oxide film for forming the upper electrode of the solar cell has resistivity of a few mΩ·cm. Additionally, the second zinc oxide film material will have an optical transmission rate, e.g. 90%, which is higher than the first zinc oxide film material.

Figure 7:
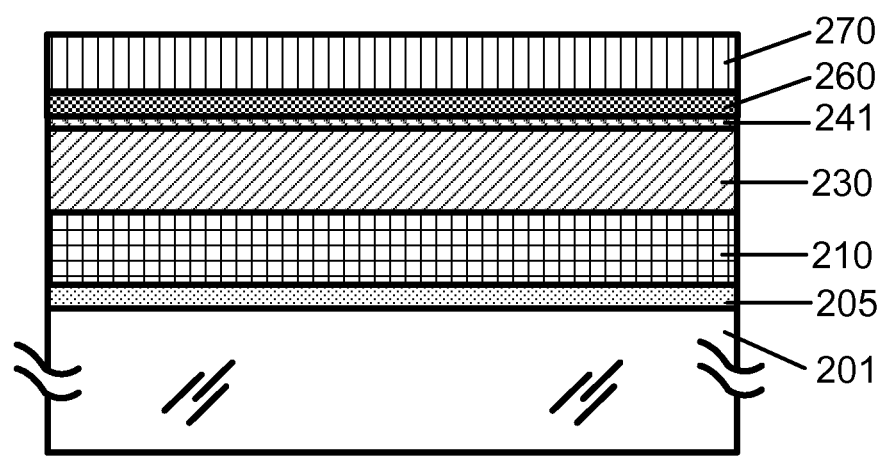
FIG. 7 is a diagram illustrating a sectional view of a Cd-free solar cell.

FIG. 7 is an illustration of a section of thin-film solar cell free of cadmium species. The thin-film solar cell is formed on a glass substrate 201 with a form factor as large as 65×165 cm. A barrier layer 205 overlies substrate 201. On the barrier layer 205, a first electrode 210 is formed, for example of metal. Then an absorber material 230 is formed and treated. In a specific embodiment, the absorber material comprises a compound such as $CuInGaSe_2$, $CuInSe_2$, $CuInGaSe_2$, $CuInGa(SeS)_2$, or a compound without Ga. This includes several manufacturing processes, including precursor film deposition and precursor treatment via a selenization and sulfurization process. The CIS/CIGS/CIGSS absorber material is further treated during a formation of a zinc doped junction structure 240. The zinc doped junction structure 240 is formed by using a chemical bath reaction between a zinc bearing solution with the CIS/CIGS/CIGSS absorber material. A top portion of the CIS/CIGS/CIGSS absorber material is transformed into a zinc-doped n-type characteristic structure separated to the p-type absorber material 230 by an interface region. The zinc doped junction structure 240 can also formed by a direct physical diffusion to allow volatile zinc species through a surface region of the CIS/CIGS/CIGSS absorber material.

Following the formation of the zinc doped junction structure, a first zinc oxide film 260 is deposited, e.g. using a MOCVD process which may be followed by an annealing process using rapid thermal annealing. These processes further activate additional zinc species in the zinc doped junction structure to determine a final zinc doping level within the junction structure and modifies the location of the interface region (junction position). The result is an n-type doping level ranging from $10^{15}$ cm$^{-3}$ to $10^{18}$ cm$^{-3}$. The first zinc oxide film 260 overlying the junction structure 241 is characterized by a high resistivity achieved by cutting off boron dopant gas flow during its formation process, thus forming a Cd-free window material together with the n-type zinc doped junction structure over the p-type absorber material. This basically eliminates a CdS buffer layer and associated chemical bath deposition process, as well as certain surface treatment processes so that the thin-film solar cell is substantially free of toxic elements. Finally, a second zinc oxide film 270 can be formed using the MOCVD process while flowing diborone dopant gas to obtain a lower resistivity and higher optical transparency compared to the first zinc oxide film 260. The second zinc oxide film 270 is patterned to form a second electrode for the thin-film solar cell.

The above sequence of steps provides a cadmium free thin-film photovoltaic device and method of forming thereof according to an embodiment of the present invention. Depending on the embodiment, steps may be added or removed without departing from the scope of the claims herein. For example, the window material and second electrode material can be deposited using techniques such as sputtering, vacuum evaporation, and chemical bath deposition, among others.

While the present invention has been described using specific embodiments, it should be understood that various changes, modifications, and variations to the method utilized in the present invention may be effected without departing from the spirit and scope of the present invention as defined in the appended claims. Additionally, embodiments according to the present invention can be applied to other thin film configurations such as those provided by a metal oxide material, a metal sulfide material or a metal selenide material.

What is claimed is:

1. A method for fabricating a thin film photovoltaic device free from cadmium comprising:
   providing a substrate having a thin film photovoltaic absorber with a surface region including a copper species, an indium species, a gallium species, a selenium species, and a sulfur species;
   subjecting the surface region to a material containing at least a zinc species which is substantially free of cadmium;
   heating at least the surface region to cause formation of zinc doped material at the surface region, wherein the heating comprises using a lamp heater to cause the surface region and adjacent regions to increase from room temperature to about 150 degrees Fahrenheit while keeping the majority of the absorber material substantially at room temperature;
   forming zinc oxide over the zinc doped material; and
   forming a transparent conductive material overlying the zinc oxide material.

2. The method of claim 1 wherein the thin-film photovoltaic absorber comprises a compound material selected from $CuInSe_2$, $CuInGaSe_2$, $CuInGa(SeS)_2$, and a combination thereof.

3. The method of claim 1 wherein the step of subjecting the surface region comprises immersing the surface at substantially room temperature in a liquid electrolyte solution which includes the zinc species.

4. The method of claim 3 wherein the liquid electrolyte solution comprises at least one of zinc chloride and zinc sulfate, each having a concentration of zinc ranging from 0.0001 Mol to 0.1 Mol, and the liquid electrolyte solution further comprises ammonium hydroxide having a concentration of ammonium hydroxide ranging from 0.1 Mol to 5 Mol, and water.

5. The method of claim 1 wherein the step of subjecting the surface region to the material comprises placing a solid film comprising volatile zinc species in proximity to the surface region.

6. The method of claim 5 wherein the solid film comprises zinc chloride film coated on a substrate disposed above the surface region at a distance ranging between 1 millimeter and 5 millimeters.

7. The method of claim 1 wherein the depth of the zinc doped material comprises less than about one tenth of a total thickness of the thin-film photovoltaic absorber and zinc has an atomic concentration of about 1020 $cm^{-3}$.

8. The method of claim 1 wherein the step of forming zinc oxide comprises using a MOCVD process at a temperature between 150° C. and 250° C. without introducing dopant gas.

9. The method of claim 8 wherein the MOCVD process comprises using a work gas including water vapor and diethylzinc, with a water-to-diethylzinc ratio greater than 1:4.

10. A method for fabricating a thin film photovoltaic device free from cadmium comprising:
provinding a substrate having a thin film photovoltaic absorber with a surface region including a copper species, an indium species, a gallium species, a selenium species, and a sulfur species;
subjecting the surface region to a material containing at least a zinc species which is substantially free of cadmium;
heating at least the surface region to cause formation of zinc doped material at the surface region;
forming zinc oxide over the zinc doped material, wherein formation comprises using a MOCVD process at a temperature between 150° C. and 250° C. without introducing dopant gas, and wherein the MOCVD process comprises using a work gas including water vapor, diethylzinc, and hydrogen sulfide to form a $ZnO_{1-x}S_x$ material overlying the zinc-doped material; and
forming a transparent conductive material overlying the zinc oxide material.

11. The method of claim 10 wherein the step forming zinc oxide material further comprises annealing the zinc oxide material deposited by the MOCVD process, causing the depth of the zinc doped material to shift and resulting in a zinc doping level ranging from 1015 cm-3 to 1018 cm-3.

12. The method of claim 1 wherein the step of forming a transparent conductive material comprises depositing a second zinc oxide material in a MOCVD process using at least diethylzinc gas combined with a diborane gas, with a ratio of diborane-to-diethylzinc gas from about one percent to about five percent.

13. The method of claim 1, wherein the lamp heater has an elongated shape to cover the substrate.

14. The method of claim 1, wherein the lamp heater is configured to scan either the length or width of the substrate.

15. The method of claim 10, wherein the water-to-diethylzinc ratio is greater than 1:4.

16. The method of claim 10, wherein the thin-film photovoltaic absorber comprises a compound material selected from $CuInSe_2$, $CuInGaSe_2$, $CuInGa(SeS)_2$, and a combination thereof.

17. The method of claim 10, wherein the step of subjecting the surface region comprises immersing the surface at substantially room temperature in a liquid electrolyte solution which includes the zinc species.

18. The method of claim 17, wherein the liquid electrolyte comprises at least one of zinc chloride and zinc sulfate, each having a concentration of zinc ranging from 0.0001 Mol to 0.1 Mol, and the liquid electrolyte solution further comprises ammonium hydroxide having a concentration of ammonium hydroxide ranging from 0.1 Mol to 5 Mol, and water.

19. The method of claim 10, wherein the step of subjecting the surface region to the material comprises placing a solid film comprising volatile zinc species in proximity to the surface region.

* * * * *